United States Patent [19]
Kawashima

[11] Patent Number: 5,218,260
[45] Date of Patent: Jun. 8, 1993

[54] LONGITUDINAL QUARTZ CRYSTAL RESONATOR

[75] Inventor: Hirofumi Kawashima, Sendai, Japan

[73] Assignee: Seiko Electronic Components Ltd., Japan

[21] Appl. No.: 824,013

[22] Filed: Jan. 22, 1992

[51] Int. Cl.⁵ .................. H01L 41/04; H01L 41/08; H01L 41/09
[52] U.S. Cl. .................. 310/361; 310/348; 310/367; 310/368
[58] Field of Search .............. 310/321, 348, 351, 361, 310/368, 367, 370

[56] References Cited

U.S. PATENT DOCUMENTS

| | | | |
|---|---|---|---|
| 3,488,530 | 1/1970 | Staudte | 310/321 |
| 3,634,787 | 1/1972 | Newell | 310/321 |
| 4,350,918 | 9/1982 | Sato | 310/367 |
| 4,450,378 | 5/1984 | Hermann et al. | 310/361 |
| 4,538,461 | 9/1985 | Juptner et al. | 310/370 |
| 4,654,663 | 3/1987 | Alsenz et al. | 310/360 |

FOREIGN PATENT DOCUMENTS

0052621  4/1980  Japan .................. 310/368

OTHER PUBLICATIONS

Patent Abstracts of Japan, vol. 014, No. 259 (E-0937) Jun. 5, 1990 & JP-A-20 79 511 (Seiko) Mar. 20, 1990.
Patent Abstracts of Japan, vol. 015, No. 121 (E-1049) Mar. 25, 1991 & JP-A-30 10 509 (Seiko) Jan. 18, 1991.
Patent Abstracts of Japan, vol. 014, No. 374 (E-0964) Aug. 13, 1990 & JP-A-21 35 907 (Seiko) May 24, 1990.

*Primary Examiner*—Steven L. Stephan
*Assistant Examiner*—C. LaBalle
*Attorney, Agent, or Firm*—Bruce L. Adams; Van C. Wilks

[57] ABSTRACT

A longitudinal quartz crystal resonator has at least two vibrating arms arranged in parallel to each other to undergo a longitudinal vibration. The vibrating arms are connected together at both ends thereof by connecting sections. A pair of bridge sections extend from central parts of respective ones of the outermost vibrating arms and are connected to flexional sections. The bridge sections are supported through surrounding frame sections by a bottom mount section. The flexional sections are connected to the frame sections so as to form surrounding openings. By such construction, an equivalent inductance and a series resistance are reduced in the longitudinal quartz crystal resonator so as to eliminate vibrating energy loss.

9 Claims, 3 Drawing Sheets

LONGITUDINAL QUARTZ CRYSTAL RESONATOR

BACKGROUND OF THE INVENTION

The present invention relates to a longitudinal quartz crystal resonator comprised of a vibrational portion and a support portion, which are formed integrally by an etching process. More specifically present invention relates to a longitudinal quartz crystal resonator having a new shape suitable for a clock signal source of a portable instrument such as an IC card, a pager or a movable communication device, which require reduction in size and power consumption.

In the conventional longitudinal quartz crystal resonator comprised of a vibrational portion and a support portion which are integrally formed by an etching process, the vibrational portion is composed of a single vibrating arm, thereby failing to reduce a series resistance $R_1$. The conventional longitudinal quartz crystal resonator having a single vibrating arm has therefore a relatively small overall mass. Therefore, the conventional resonator suffers from asymmetricity of shape caused by the etching process due to structural anisotropy of the quartz crystal. The asymmetricity of shape may affect oscillating performance. In view of this, the conventional resonator has a relatively great vibrational energy loss through the support portion, thereby causing serious problems such as increase in the value of $R_1$. Further, there remains simultaneously another problem that oscillation starting response is relatively slow due to a great amount of an equivalent inductance $L_1$. There has long been desired a longitudinal quartz crystal resonator having small values of $R_1$ and $L_1$.

SUMMARY OF THE INVENTION

In order to achieve an object of the invention, according to the present invention, in the longitudinal quartz crystal resonator having a vibrational portion and a support portion which are formed integrally by an etching process, the vibrational portion has a plurality of vibrating arms. These vibrating arms are coupled at their tip end portions to each other through connecting sections to thereby form a closed shape. Further, a pair of outermost vibrating arms are connected at their intermediate or central parts to the support portion through corresponding bridge sections.

The inventive resonator features a plurality of vibrating arms held by the support portion. The total mass of the plural vibrating arms is apparently greater than the mass of a single vibrating arm, hence the inventive resonator has a greater potential energy. Accordingly, a resistance force applied from the support portion to each vibrating arm can be reduced, when estimated per each vibrating arm. The electromagnetic energy is increased concurrently. Accordingly, there can be obtained a longitudinal quartz crystal resonator having reduced values of the series resistance $R_1$ and the equivalent inductance $L_1$.

DESCRIPTION OF EMBODIMENTS

Figure 1:
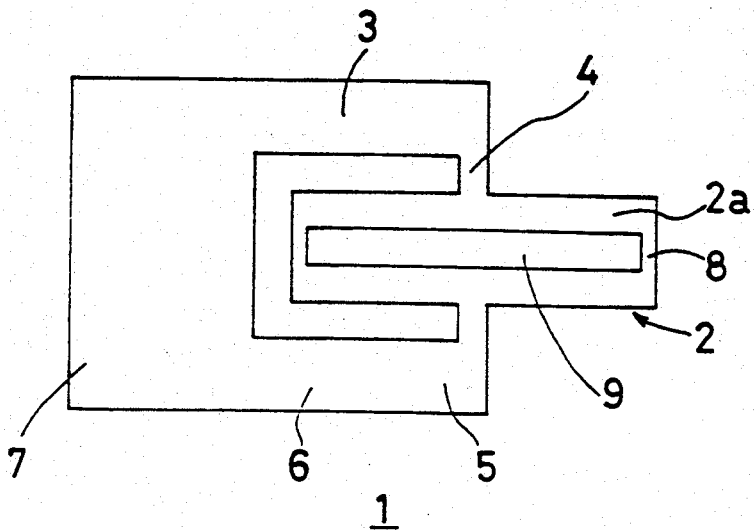
FIG. 1 is a plan view showing a first embodiment of the inventive longitudinal quartz crystal resonator.

Embodiments of the present invention will be described in detail with reference to the drawings. FIG. 1 shows a plan view of the first embodiment of the inventive longitudinal quartz crystal resonator. The resonator 1 is comprised of a vibrational portion 2 and a support portion 3 coupled to the vibrational portion 2 through bridge sections 4. Further, the vibrational portion 2 is comprised of a pair of vibrating arms 2a which are connected to each other through connecting sections 8 which are substantially free of strain to thereby enclose an opening 9. On the other hand, the support portion 3 is comprised of frame sections 6 and a mount section 7. Each frame section 6 is connected to the corresponding bridge section 4 extended from a central or intermediate part of the vibrating arm 2a to form a flexional section 5 which undergoes a flexional vibration. Further, excitation electrodes (not shown) are arranged such as to vibrate the pair of vibrating arms in the same direction. Consequently, the inventive resonator has an equivalent inductance reduced by half, an equivalent capacitance increased by double, and a series resistance $R_1$ reduced by half, as compared to the conventional resonator having a signal vibrating arm, while these values are measured in the resonant oscillating state. For example, the conventional resonator of the single vibrating arm type has the series resistance value of $R_1 = 380\Omega$ at a frequency of $f \approx 450$ KHz, whereas the inventive resonator of the double vibrating arm type has the series resistance value of $R_1 = 195\Omega$ which substantially reduces the conventional value by half.

Figure 2:
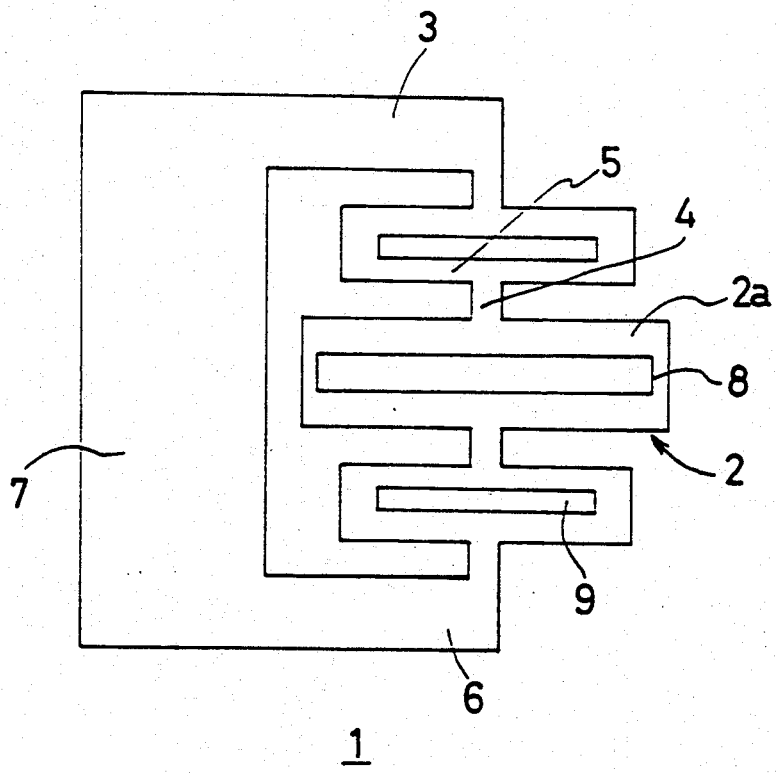
FIG. 2 is a plan view showing a second embodiment of the inventive longitudinal quartz crystal resonator.

FIG. 2 shows a plan view of the second embodiment of the inventive longitudinal quartz crystal resonator. The resonator 1 is comprised of a vibrational portion 2 and a support portion 3. The vibrational portion 2 is comprised of a pair of vibrating arms 2a and connecting sections 8 arranged in manner similar to the FIG. 1 resonator. The supporting portion 3 is constructed to more efficiently confine the vibrating energy within the vibrational portion 2, such that the supporting portion 3 is comprised of a pair of bridge sections 4, corresponding flexional sections 5 connected to the respective bridge sections 4, and corresponding frame sections 6 coupled to the respective flexional section 5 to form each opening 9, and a mount section 7 connected to the pair of frame sections 6. By such construction, the series resistance $R_1$ is further reduced and simultaneously the vibrating energy is more efficiently confined within the vibrational portion, thereby providing an improved longitudinal quartz crystal resonator substantially free of vibrating energy loss.

Figure 3:
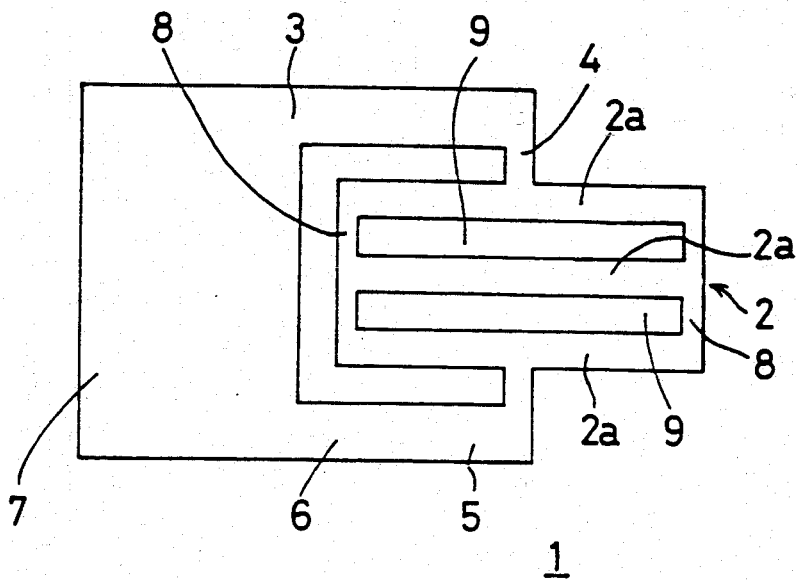
FIG. 3 is a plan view showing a third embodiment of the inventive longitudinal quartz crystal resonator.

FIG. 3 shows a plan view of the third embodiment of the inventive longitudinal quartz crystal resonator. The resonator 1 is comprised of a vibrational portion 2 and a support portion 3 coupled to the vibrational portion 2 through a pair of bridge sections 4. The vibrational portion 2 is comprised of three vibrating arms 2a arranged in parallel to each other, and being connected together at their ends which are substantially free of strain through connecting sections 8 to form openings 9. Further, the support portion 3 is comprised of a pair of bridge sections 4 extended from intermediate parts of the outermost pair of vibrating arms 2a, a pair of frame sections 6 including a pair of flexional sections 5 connected to the corresponding bridge sections 4 to undergo a flexional vibration according to Poisson's ratio. Further, excitation electrodes (not shown) are arranged to vibrate or drive the three vibrating arms 2a in the same direction. Consequently in the resonant oscillating state of the resonator, the equivalent inductance is reduced by about one-third, the equivalent capacitance is increased by about three times, and the series resistance is reduced by about one-third, as compared to the conventional resonator of the single vibrating arm type.

Figure 4:
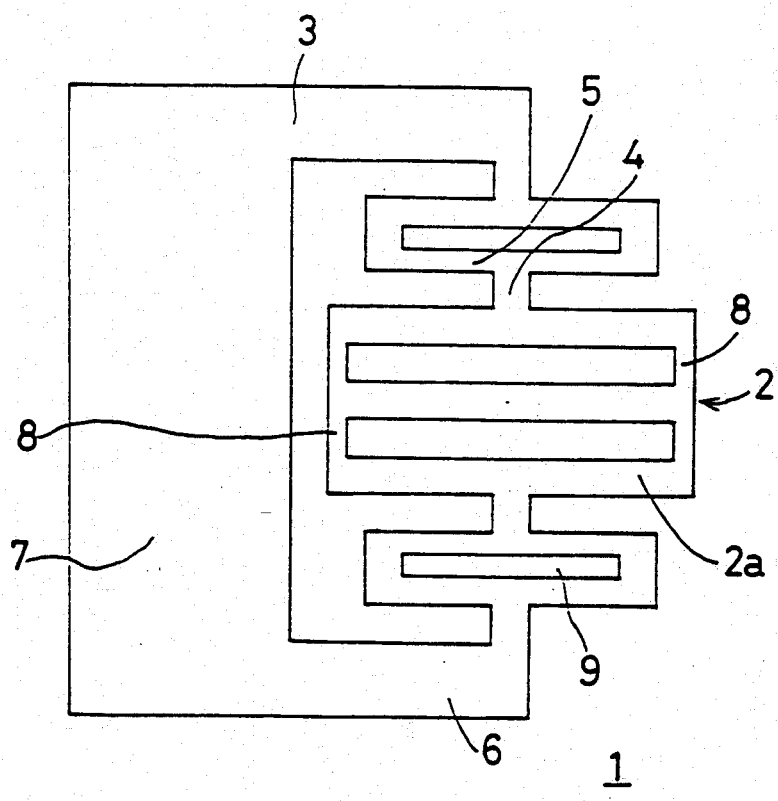
FIG. 4 is a plan view showing a fourth embodiment of the inventive longitudinal quartz crystal resonator.

FIG. 4 shows a plan view of the fourth embodiment of the inventive longitudinal quartz crystal resonator. The resonator is comprised of a vibrational portion 2 and a support portion 3. The vibrational portion 2 is composed of three vibrating arms 2a including a first vibrating arm 2a connected with a first bridge section 4 and a last vibrating arm 2a connected with a second bridge section connecting sections 8 arranged in a manner similar to the FIG. 3 resonator. The support portion 3 is constructed so as to confine the vibrating energy more efficiently within the vibrational portion 2, such that the support portion 3 is composed of a pair of flexional sections 5 connected to respective bridge sections 4, a pair of frame sections 6, including a first frame section 6 and a second frame section 6, connected at their opposite ends to the corresponding flexional sections 5, including a first flexional section 5 and a second flexional section 5, to form respective surrounding openings 9, and a mount section 7 connected to the frame sections 6. By such construction, the series resistance $R_1$ is further reduced, while the vibrating energy is more efficiently confined within the vibrational portion, thereby producing an improved longitudinal quartz crystal resonator substantially free of vibrating energy loss.

Figure 5:
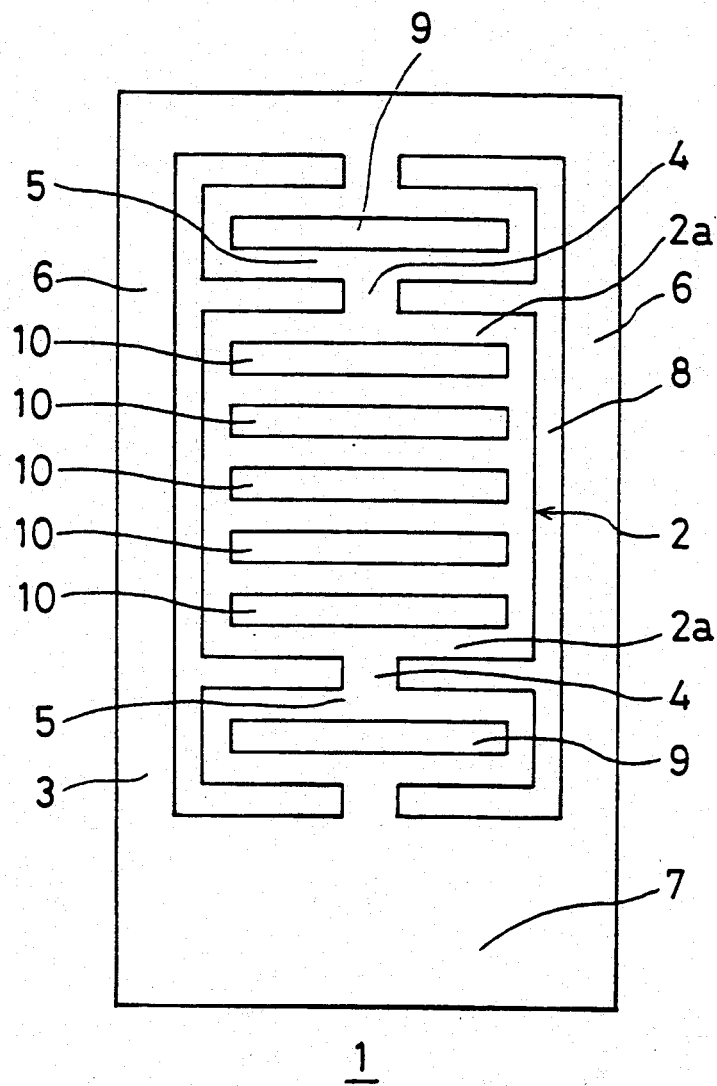
FIG. 5 is a plan view showing a fifth embodiment of the inventive longitudinal quartz crystal resonator.

FIG. 5 shows a plan view of the fifth embodiment of the longitudinal quartz crystal resonator. The resonator 1 is comprised of a vibrational portion 2, and a support portion 3 connected to the vibrational portion 2 through bridge sections 4. Further, the vibrational portion 2 is comprised of six vibrating arms 2a arranged in parallel to each other and coupled together at their end portions which are substantially free of strain through connecting sections 8 to form openings 10. The support portion 3 is constructed to efficiently confine the vibrating energy within the vibrational portion 2. Namely, the support portion 3 is comprised of a pair of flexional sections connected to the respective bridge sections 4, a pair of frame sections 6 each connected at its opposite ends to the corresponding flexional section 5 to define a second opening 9, and a mount section 7 connected to the pair of frame sections 6. Further, exciting electrodes (not shown) are formed on etched faces of the six vibrating arms 2a.

Accordingly, in the resonant oscillating state, the inventive resonator has an equivalent inductance reduced by about one-sixth, an equivalent capacitance increased by about six times, and a series resistance $R_1$ reduced by more or less one-sixth (depending on design detail of the support portion), as compared to the conventional resonator of the single vibrating arm type. In general, if N number of vibrating arms are integrated in the vibrational portion, the equivalent inductance is reduced by about one-Nth.

By such construction, the equivalent inductance is significantly reduced so that rising duration at the start of oscillation can be shortened to achieve quick start response. Further, the series resistance $R_1$ is reduced while the vibrating energy is confined within the vibrational portion, thereby providing an improved longitudinal quartz crystal resonator substantially free of vibrating energy loss. Moreover, although the inventive resonator has a complicated configuration, the resonator can be integrally formed by a chemical etching process.

As described above, according to the present invention, the longitudinal quartz crystal resonator has a new shape which is comprised of a vibrational portion and a support portion and which is formed integrally by an etching process, thereby achieving the following effects:

(1) A plurality of vibrating arms are provided so that the equivalent inductance of the resonator can be reduced to thereby shorten, the rising time at the start of oscillation;

(2) The series resistance $R_1$ of the resonator is also reduced by integrating a plurality of the vibrating arms;

(3) The vibrational portion and the support portion are formed integrally by etching process, thereby an reducing the size and thickness of the resonator;

(4) The shape of the support portion is improved to thereby produce a resonator substantially free of vibrating energy loss. Therefore, the resonator has a small series resistance $R_1$, while the resonator is connected to external leads, through the mount section of the resonator;

(5) The resonators can be produced by a batch etching process, and an individual resonator is connected to external leads at the mount section disposed one side of the resonator piece, thereby facilitating production at low cost.

What is claimed is:

1. A longitudinal quartz crystal resonator comprising:
a plurality of vibrating arms each having a width and arranged in parallel to each other;
connecting sections for connecting the plurality of vibrating arms at their ends, the connecting sections having a width not greater than the width of the vibrating arms;
bridge sections extending from intermediate parts of the respective vibrating arms;
a pair of frame sections connected to the respective bridge sections and being supported integrally at their ends, the respective frame sections being integrally formed with a mount portion; and
wherein the center portions of each of the plurality of vibrating arms are connected to flexional sections through the bridge sections, and the flexional sections are connected to the frame sections so as to form surrounding openings.

2. A longitudinal quartz crystal resonator according to claim 1; wherein the plurality of vibrating arms includes at least three vibrating arms.

3. A longitudinal quartz crystal resonator, comprising: a mount section; a first frame section and a second frame section integrally fixed with and extending from the mount section; a vibrational portion comprising a plurality of parallel vibrating arms including at least a first vibrating arm and a last vibrating arm, and connecting sections connecting together the plurality of vibrating arms at the ends of the vibrating arms, a first bridge section extending from an intermediate part of the first vibrating arm and a second bridge section extending from an intermediate part of the last vibrating arm; and a first flexional section connected at one end with the first frame section so as to define a surrounding opening and connected at another end with the first vibrating arm through the first bridge section, and a second flexional section connected at one end with the second frame section so as to define a surrounding opening and connected at another end with the last vibrating arm through the second bridge section.

4. A longitudinal quartz crystal resonator according to claim 3; wherein the plurality of vibrating arms includes at least one additional vibrating arm disposed between the first vibrating arm and the last vibrating arm.

5. A longitudinal quartz crystal resonator according to claim 3; wherein each vibrating arm has a width and each connecting section has a width not more than the width of each vibrating arm connected thereto.

6. A longitudinal quartz crystal resonator according to claim 3; wherein each vibrating arm has a width and each connecting section has a length not more than the width of each vibrating arm connected thereto.

7. A longitudinal quartz crystal resonator according to claim 3; wherein the connecting sections connect the ends of the plurality of vibrating arms.

8. A longitudinal quartz crystal resonator according to claim 3; wherein the first bridge section extends laterally from the center of the first vibrating arm and the second bridge section extends laterally from the center of the last vibrating arm.

9. A longitudinal quartz crystal resonator according to claim 8; wherein the resonator comprises a one-piece etched resonator.

* * * * *